(12) United States Patent
van Dal

(10) Patent No.: US 8,722,520 B2
(45) Date of Patent: May 13, 2014

(54) METHOD OF FABRICATING A SEMICONDUCTOR DEVICE HAVING AN EPITAXY REGION

(75) Inventor: Mark van Dal, Heverlee (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 13/298,529

(22) Filed: Nov. 17, 2011

(65) Prior Publication Data

US 2012/0088344 A1   Apr. 12, 2012

Related U.S. Application Data

(63) Continuation of application No. 12/900,895, filed on Oct. 8, 2010, now Pat. No. 8,062,963.

(51) Int. Cl.
*H01L 21/20* (2006.01)
*H01L 21/36* (2006.01)

(52) U.S. Cl.
USPC .... 438/481; 438/486; 438/197; 257/E21.103; 257/E21.166

(58) Field of Classification Search
USPC .................................. 438/481, 486
See application file for complete search history.

(56) References Cited

U.S. PATENT DOCUMENTS

| | | | |
|---|---|---|---|
| 6,495,294 B1 | 12/2002 | Yamauchi et al. | |
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2006/0284210 A1* | 12/2006 | Mathew et al. | 257/149 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2008/0073667 A1 | 3/2008 | Lochtefeld | |
| 2008/0099785 A1 | 5/2008 | Bai et al. | |

(Continued)

OTHER PUBLICATIONS

Ming-Lung Cheng, et al. U.S. Appl. No. 12/780,124, "Method and Apparatus for Enhancing Channel Strain," filed May 14, 2010, 35 pages.

(Continued)

*Primary Examiner* — Daniel Whalen
*Assistant Examiner* — Shaka White
(74) *Attorney, Agent, or Firm* — Haynes and Boone, LLP

(57) ABSTRACT

A method is described what includes providing a substrate having a first trench and a second trench. An epitaxy material (crystalline material) is formed in the first trench and in the second trench. The top surface of the epitaxy material in the first trench is noncollinear with a top surface of the epitaxy material in the second trench. An amorphous semiconductor layer is formed on the crystalline material. Subsequently, the amorphous layer is converted, in part or in whole, into the crystalline semiconductor material. In an embodiment, a planarization process after the conversion provides crystalline regions having a coplanar top surface.

19 Claims, 8 Drawing Sheets

(56) References Cited

U.S. PATENT DOCUMENTS

| | | | |
|---|---|---|---|
| 2008/0258228 A1 | 10/2008 | Chuang et al. | |
| 2008/0263492 A1 | 10/2008 | Chuang et al. | |
| 2008/0290470 A1 | 11/2008 | King et al. | |
| 2008/0296632 A1 | 12/2008 | Moroz et al. | |
| 2009/0035909 A1 | 2/2009 | Chang et al. | |
| 2009/0155979 A1 | 6/2009 | Son et al. | |
| 2009/0181477 A1 | 7/2009 | King et al. | |
| 2010/0006945 A1 | 1/2010 | Merelle et al. | |
| 2010/0006974 A1 | 1/2010 | Xu et al. | |
| 2010/0052059 A1 | 3/2010 | Lee | |
| 2010/0183961 A1 | 7/2010 | Shieh et al. | |
| 2010/0197121 A1* | 8/2010 | Kim et al. | 438/486 |
| 2010/0203734 A1 | 8/2010 | Shieh et al. | |
| 2010/0264468 A1 | 10/2010 | Xu | |
| 2011/0073919 A1 | 3/2011 | Pawlak et al. | |
| 2011/0101421 A1 | 5/2011 | Xu | |
| 2011/0117679 A1 | 5/2011 | Lee et al. | |
| 2011/0147846 A1 | 6/2011 | Su et al. | |
| 2011/0193141 A1 | 8/2011 | Lin et al. | |
| 2011/0248348 A1 | 10/2011 | Gan et al. | |

OTHER PUBLICATIONS

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

* cited by examiner

METHOD OF FABRICATING A SEMICONDUCTOR DEVICE HAVING AN EPITAXY REGION

CROSS REFERENCE TO RELATED APPLICATIONS

The present application is a continuation of U.S. Utility Application Ser. No. 12/900,895 filed on Oct. 8, 2010, the entire disclosure of which is incorporated herein by reference.

BACKGROUND

The semiconductor integrated circuit (IC) industry has experienced rapid growth. Technological advances in IC materials and design have produced generations of ICs having smaller and higher performing circuits than previous generations. One such advancement is the recognition of materials having higher hole mobility than that of silicon. Therefore, there is a desire to replace silicon as the p-channel material for future CMOS generations (e.g., technology nodes).

This desire to have a high mobility p-channel material must be balanced with the need and/or desire to maintain silicon substrates as a fabrication vehicle. Furthermore, silicon-based peripheral circuitry such as, I/O and ESD devices, are often desired. However, due to the lattice mismatch of the higher hole mobility p-channel material and silicon, integrating the materials can be challenging.

Thus, what is desired is a device and method of forming thereof that includes a low-defect, high hole mobility material disposed on a substrate (e.g., silicon wafer).

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over, on, abutting, etc, a second feature in the description that follows may include embodiments in which the first and second features are formed in direct contact, and may also include embodiments in which additional features may be formed interposing the first and second features, such that the first and second features may not be in direct contact. Similarly, the formation of a feature on a substrate may include formation of a feature on or in one or more layers formed on a substrate. Various features may be arbitrarily drawn in different scales for simplicity and clarity.

Figure 1:
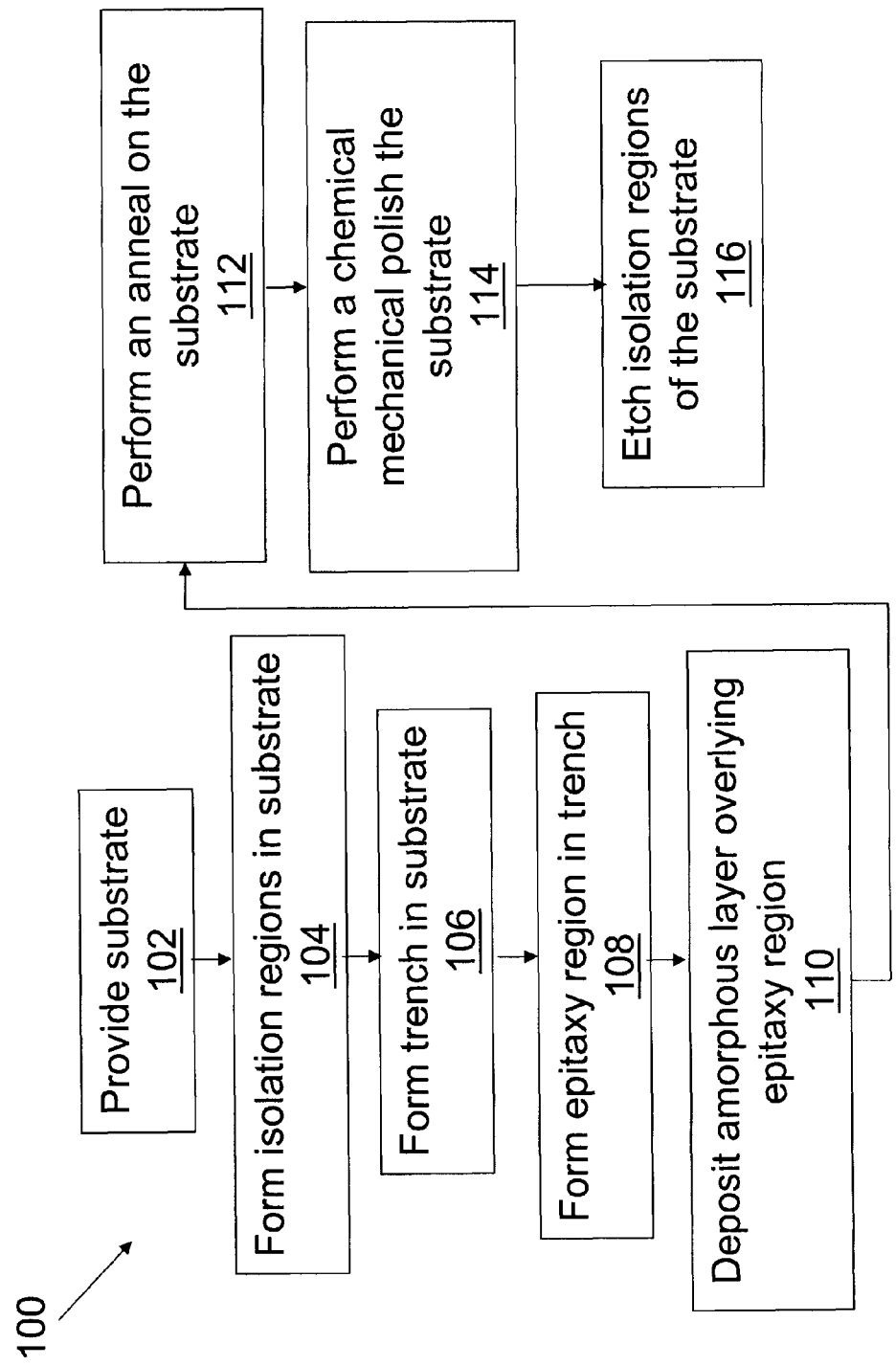
FIG. 1 is a flowchart of an embodiment of a method of fabricating a semiconductor device according to one or more aspects of the present disclosure.

Illustrated in FIG. 1 is an embodiment of a method 100 of fabricating a semiconductor device. FIGS. 2-8 are embodiments of an exemplary semiconductor device at various stages of fabrication according to the method 100 of FIG. 1. It should be understood that the embodiments described herein are exemplary only and not intended to be limiting.

The method 100 begins at block 102 where a substrate is provided. The substrate may be a semiconductor substrate. In an embodiment, the substrate is silicon in a crystalline structure. Other exemplary materials include other elementary semiconductors such as germanium, or compound semiconductors such as, silicon carbide, gallium arsenide, indium arsenide, and indium phosphide. The substrate may be a silicon-on-insulator (SOI) substrate. Referring to the example of FIG. 2, a semiconductor device 200 including a semiconductor substrate 202 is illustrated. In an embodiment, the substrate 202 is silicon in a crystalline structure.

The method 100 then proceeds to block 104 where one or more isolation regions are formed on the substrate. The isolation regions may be trench isolation features such as shallow trench isolation (STI) features. The STI features may be formed by etching apertures in the substrate using processes such as reactive ion etch (RIE) after photolithography patterning, and/or other suitable processes. The apertures may then be filled with an insulator material, such as an oxide. In an embodiment, the process includes conformal low-pressure chemical vapor deposition (LPCVD) of oxide to fill the apertures, and continues with a chemical mechanical polish (CMP) process to planarize the oxide. Other suitable processes may be used in addition and/or in lieu of those described.

Figure 2:
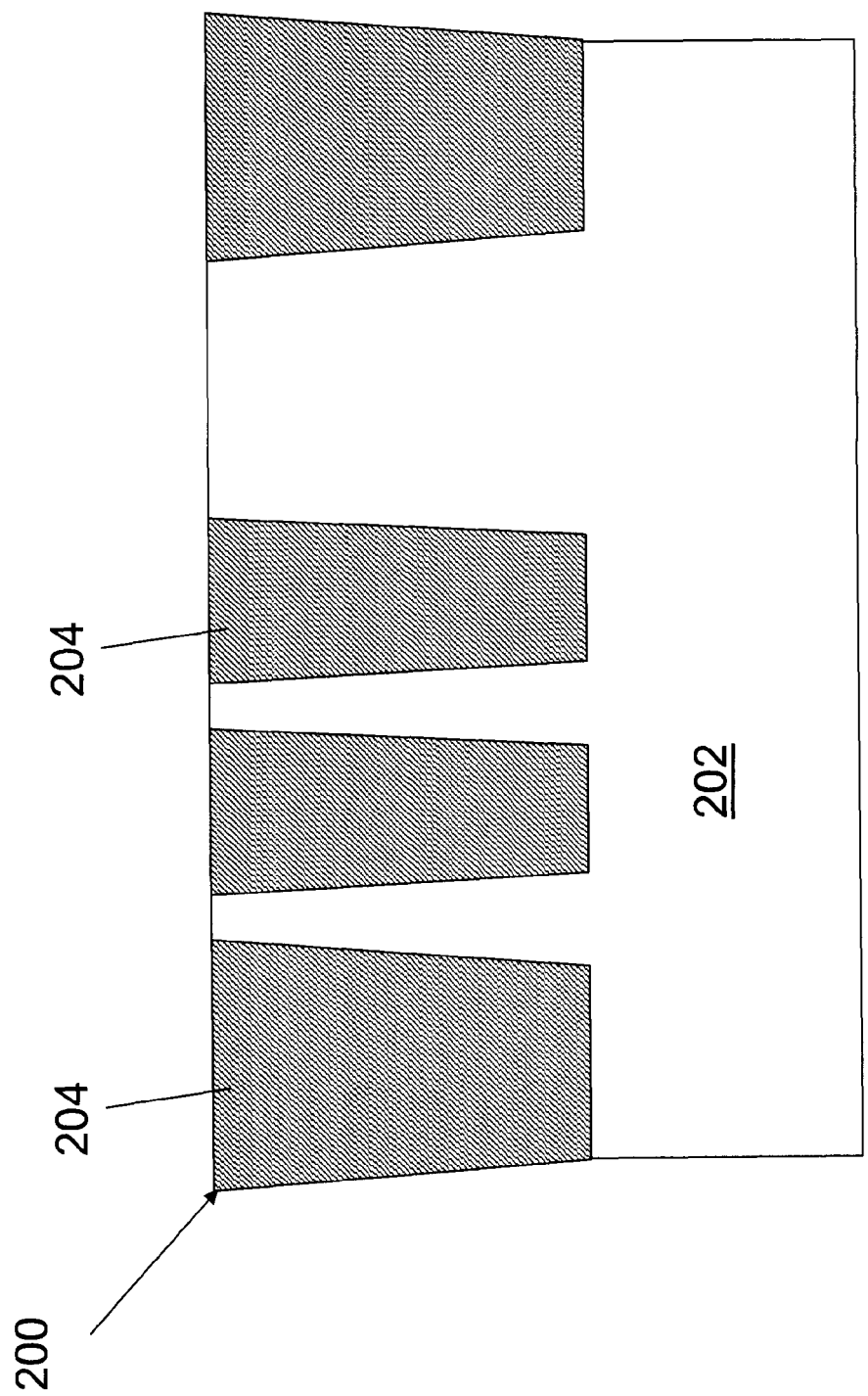
FIGS. 2-8 illustrate embodiments of semiconductor device according to one or more steps of the method of FIG. 1.

Referring to the example of FIG. 2, a plurality of STI features 204 are illustrated. As illustrated, the STI features 204 may have different widths. Numerous other embodiments are possible depending on the desired design and configuration of the resultant device. The STI features 204 may define isolation regions of a semiconductor device 200 that interpose active regions. One or more functional devices may be subsequently formed on the active regions such as, n-type field effect transistors (NFET) and p-type field effect transistors (PFET).

The method 100 then proceeds to block 106 where one or more trenches are formed on the substrate. The trenches may be formed by performing etching processes to remove substrate material adjacent and/or interposing the shallow trench isolation features, described above with reference to block 104. The trenches may be formed by dry etching, vapor HCl etching, and/or other suitable etching processes. In an embodiment, the trenches are defined by the isolation region (e.g., bounded by the sidewall of an STI structure). In an embodiment, the trench depth is between approximately 50 and approximately 200 nm, by way of example and not intended to be limiting.

Figure 3:
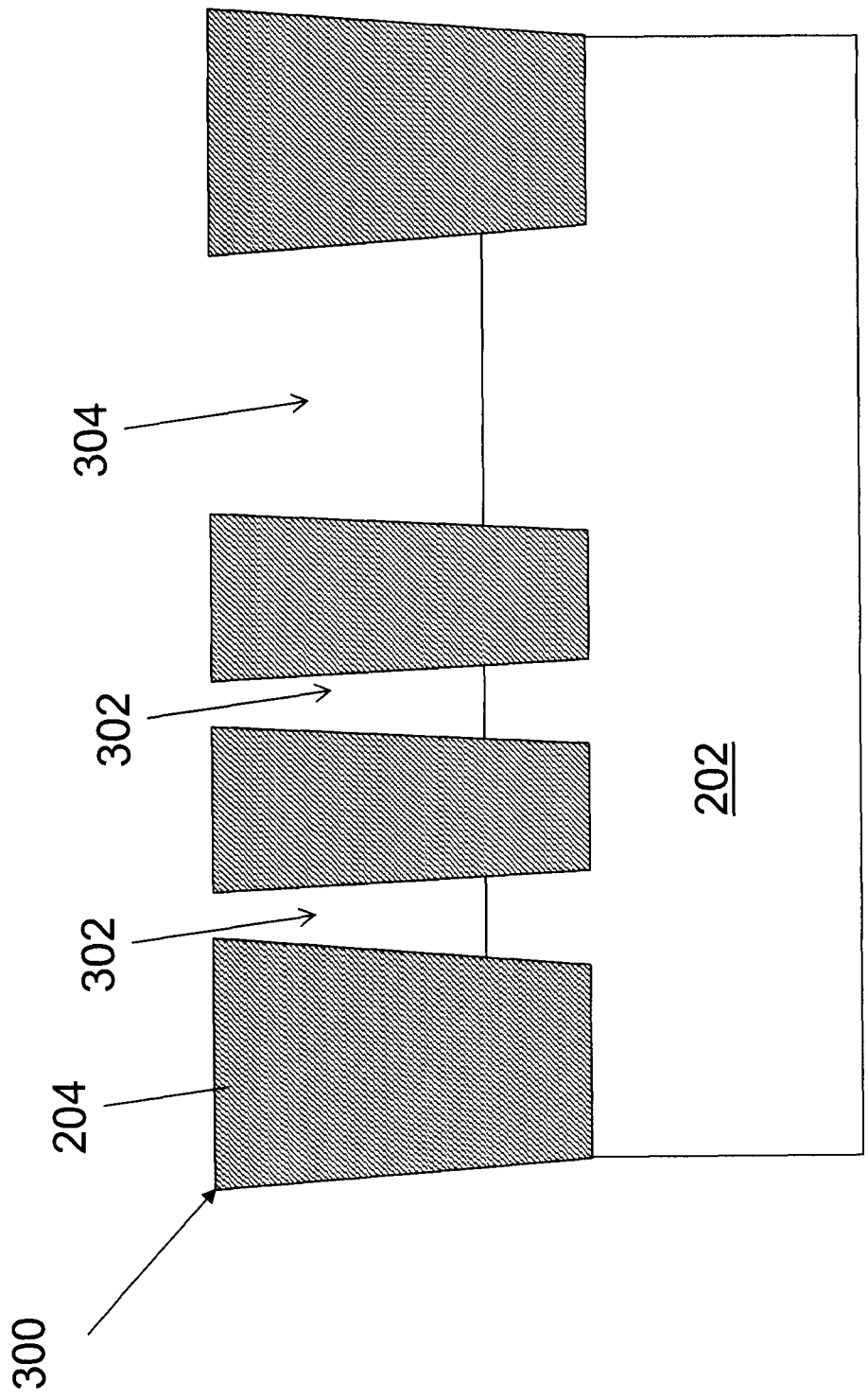

Referring to the example of FIG. 3, a device 300 illustrates trenches 302 and a trench 304 formed in the substrate 202 adjacent to and interposing the STI features 204. It is noted that the trench 304 is greater in width than the trenches 302. The trenches 302 and 304 are defined by the sidewalls of the STI features 204.

The method 100 then proceeds to block 108 where an epitaxy region (or epitaxial layer or epi layer) is formed on the substrate. The epitaxy region includes epitaxially-grown (epi) semiconductor material. The epitaxially-grown semiconductor material is a monocrystalline in structure (referred to herein as crystalline). In an embodiment, the epitaxy region includes germanium. In an embodiment, the epitaxy region is germanium in crystalline structure (crystalline germanium).

Other exemplary compositions include other III-V materials such as InP, InGaAs, InAs, combinations thereof, and/or other suitable materials. The epitaxy region may be formed using processes such as vapor phase epitaxy (VPE), molecular beam epitaxy (MBE), liquid phase epitaxy (LPE), and/or other suitable processes. The epitaxy regions may be doped, or undoped, during formation. In an embodiment, the epitaxially-grown semiconductor material includes a different composition (e.g., at least one different element) than the substrate. For example, in an embodiment, the epitaxially-grown material is germanium and the substrate is silicon.

The epitaxially-grown material may be selectively grown or formed in the trench(es) formed in block 106, described above. In an embodiment, the epitaxy region is formed in situ with etching the trenches. The epitaxy region may completely or partially fill the trenches, as further discussed below. The epitaxy region may be less than approximately 1 µm in thickness.

Figure 4:
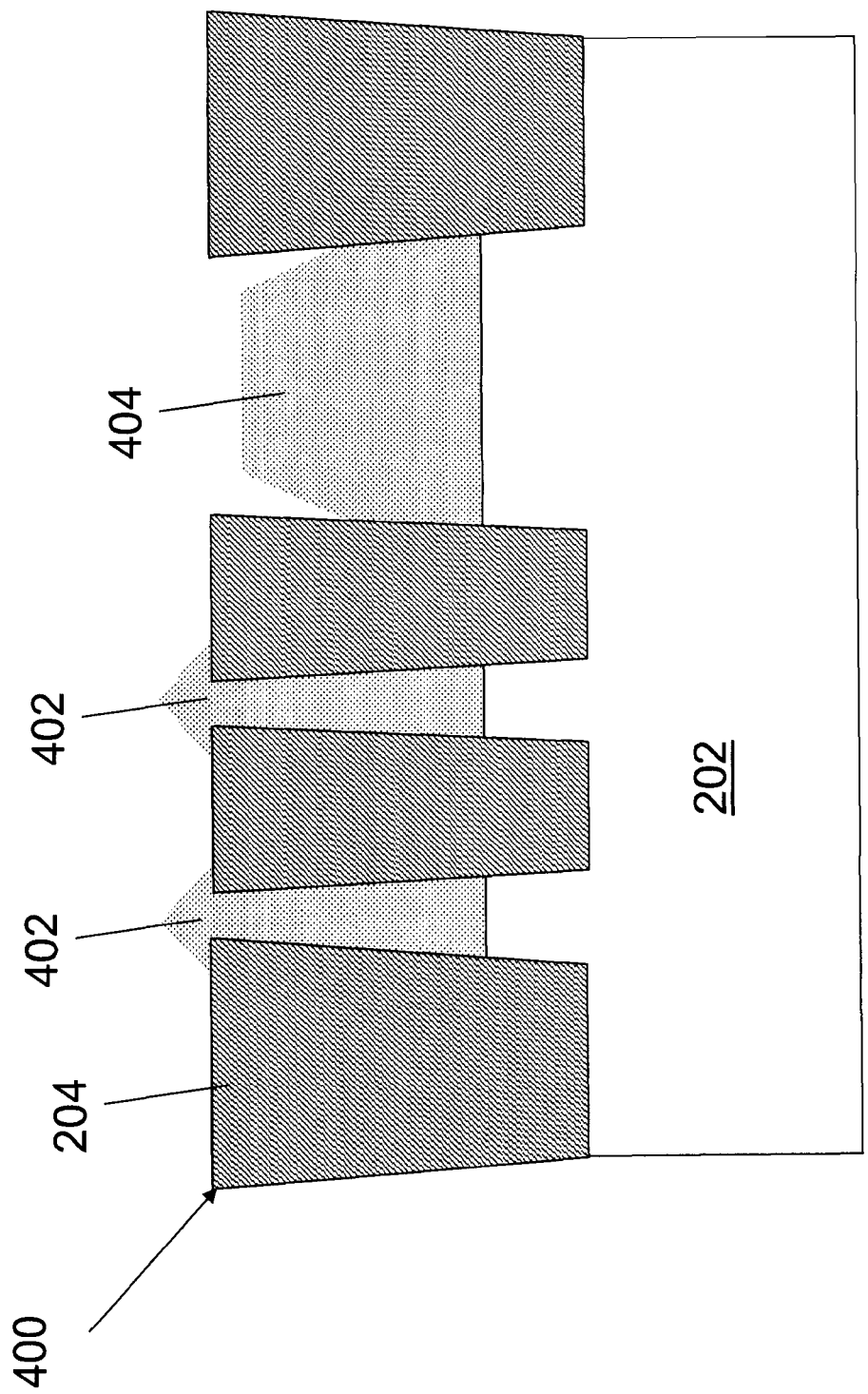

Referring to the example of FIG. 4, illustrated is a device 400, at a subsequent phase of fabrication. The device 400 includes epitaxy regions 402 and 404. In an embodiment, the epitaxy regions 402 and 404 include germanium in a crystalline structure. In an embodiment, the epitaxy regions 402 and 404 are undoped germanium. It is noted the epitaxy region 404 does not completely fill the trench 304, while the epitaxially grown material of the epitaxy region 402 overfill the trenches 302.

It may be disadvantageous to grow the epi material in the trenches such that all trenches on the substrate are completely filled. First, this requires extensive epi growth (e.g., 500 nm or 1 micron). Furthermore, this may provide a highly non-planar surface of the substrate due to the loading effects of the trench sizes and configuration. For example, the relatively narrow trenches will be vastly overfilled. This may lead to large variations in within-wafer uniformity. Specifically, a non-planar surface may cause issues in subsequent processes such as chemical mechanical polishing (CMP). This may further cause large differences in epi layer height after CMP processing. One or more of these issues are remedied by embodiments described herein.

Referring again to FIG. 1, the method 100 then proceeds to block 110 where an amorphous layer is deposited overlying the epitaxy region(s). The amorphous layer may be a semiconductor material having a disordered atomic structure (as opposed to crystalline structure). The amorphous layer may have the same elemental composition as the epitaxy region, described above with reference to block 108 of the method 100, but have a different atomic structure (e.g., ordered, disordered). In an embodiment, the amorphous layer is amorphous germanium. Other exemplary compositions include III-V materials such as InP, InGaAs, InAs, combinations thereof, and/or other suitable materials. The amorphous layer may be a substantially self-planarizing layer. In an embodiment, the thickness of the amorphous layer applied is determined based on the topography of the underlying substrate and trenches. The thickness may be such that a substantially planar surface is formed. In an embodiment, the thickness of the amorphous layer is less than approximately 1 µm. In an embodiment, the amorphous layer has a thickness of between approximately 200 and approximately 500 nm, by way of example and not intended to be limiting. The amorphous layer may be formed using chemical vapor deposition (CVD), plasma-enhanced CVD (PECVD), and/or other suitable processes.

Figure 5:
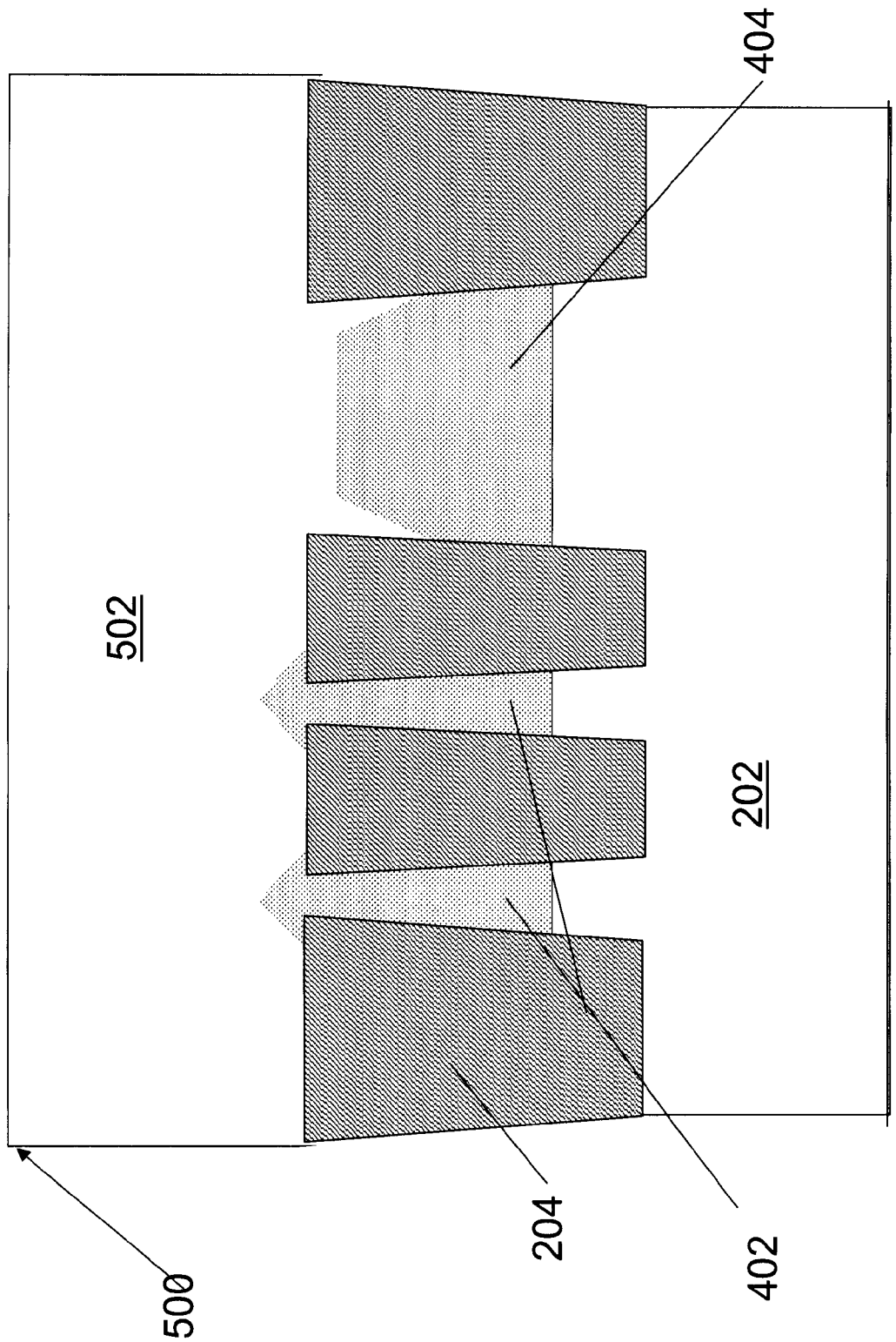

Referring to the example of FIG. 5, a device 500, at a subsequent stage of fabrication, is illustrated. The device 500 includes an amorphous layer 502 overlying the epitaxy regions 402 and 404. In an embodiment, the amorphous layer 502 is amorphous germanium (a-Ge). In an embodiment, the amorphous layer 502 is a-Ge, the epitaxy regions 402, 404 are germanium in crystalline structure (c-Ge). In a further embodiment, these germanium regions are disposed on a crystalline silicon substrate.

The method 100 then proceeds to block 112 where an anneal is performed on the substrate. The anneal may be a low-temperature or medium-temperature anneal. In an embodiment, the anneal may be between approximately 400 and 500 C for an embodiment growing a germanium region, however, numerous other embodiments are possible. The anneal may include a solid phase epitaxy process. In an embodiment, the anneal is a solid phase epitaxial regrowth (SPER) anneal. The anneal converts a portion of the amorphous layer to crystalline material. In other words, the epitaxy regions act as a seed for the crystalline growth (or regrowth) or arrangement of portions of the amorphous layer. In an embodiment, SPER occurs for a crystalline material at 40-50% of the melting temperature without substantial self-diffusion of the elements.

Figure 6:
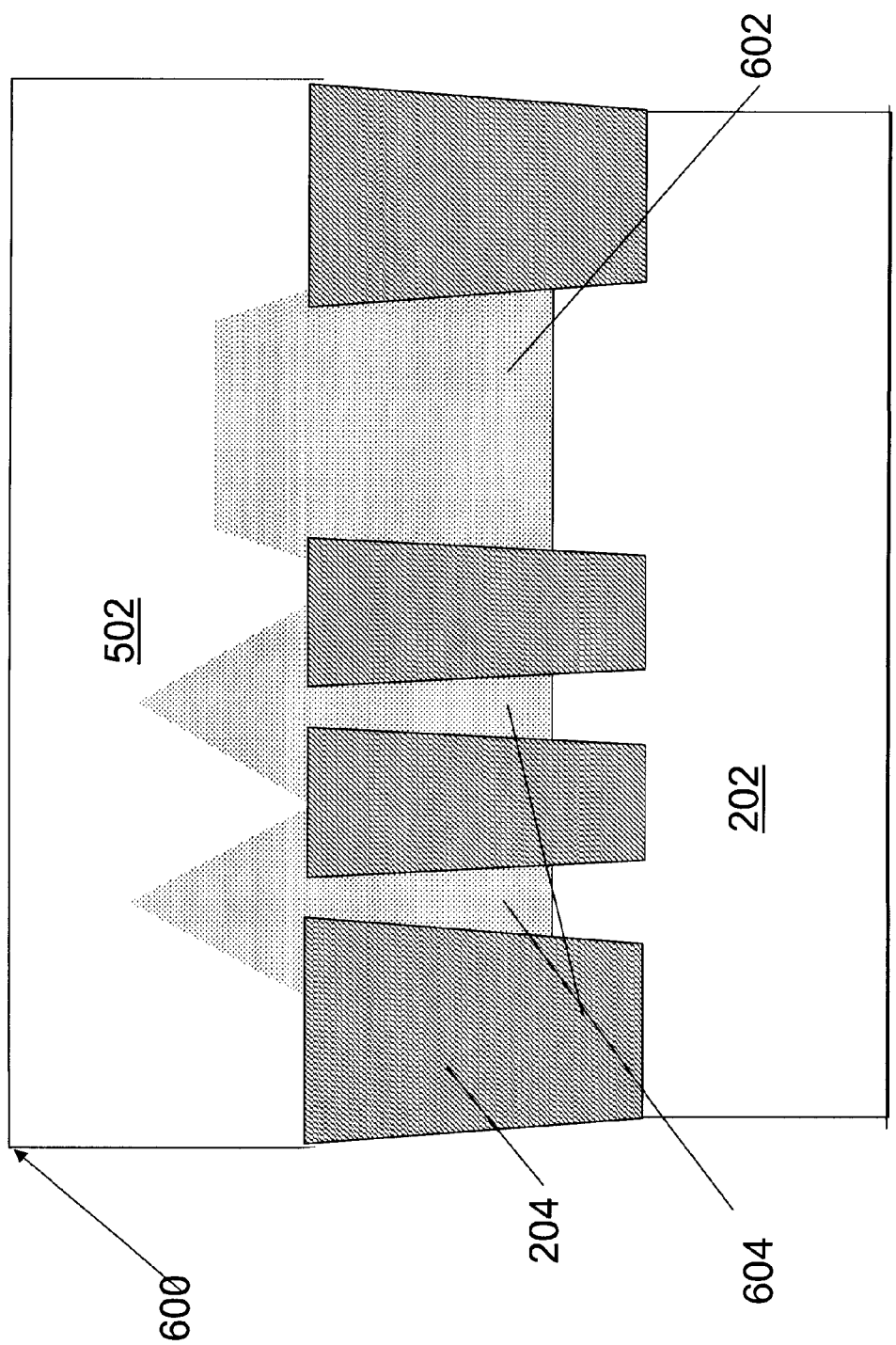
Figure 7:
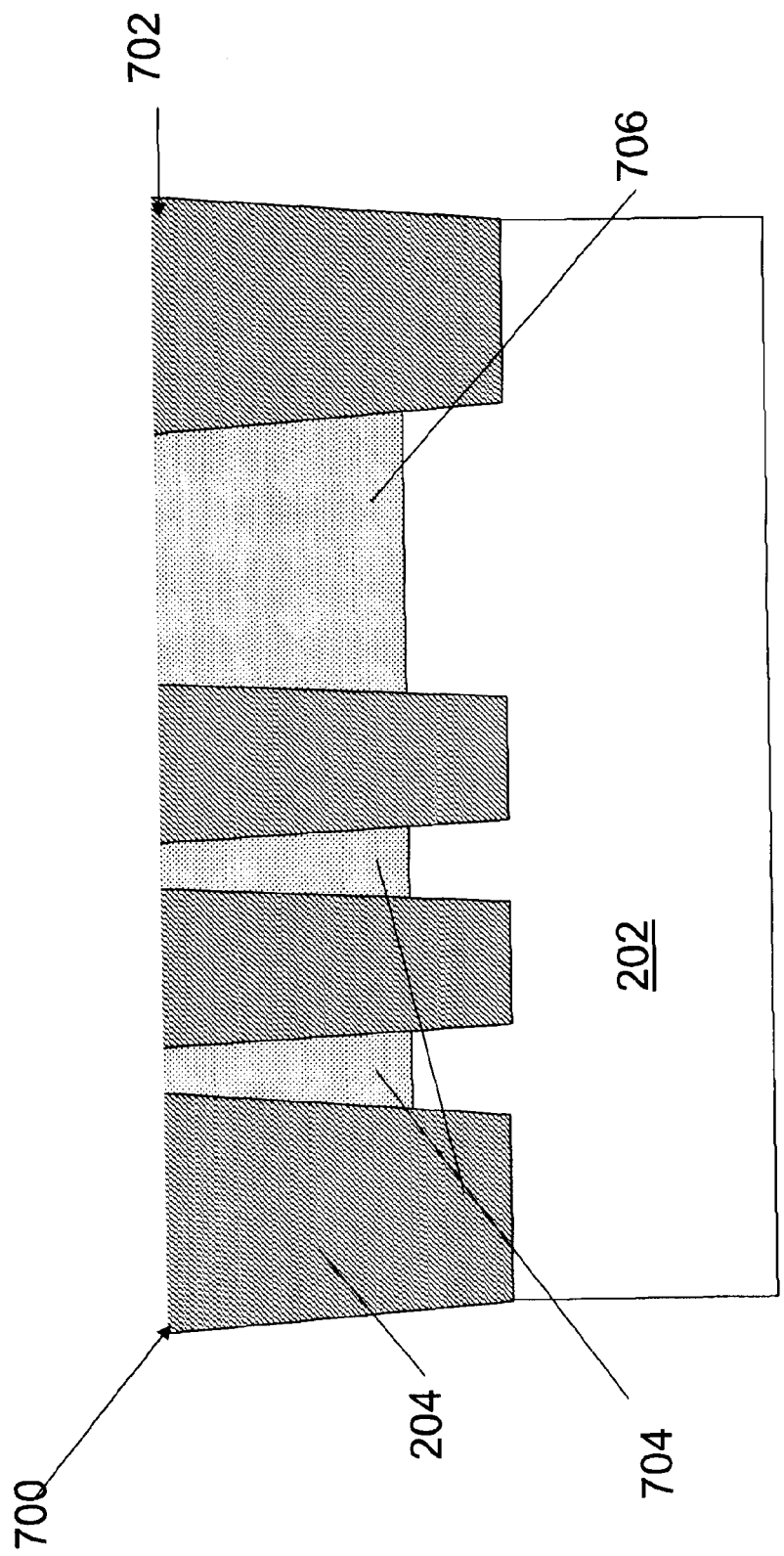

Referring to the example of FIG. 6, a device 600 is illustrated at a subsequent phase of fabrication. The device 600 includes a crystalline region which has grown is size on account of the anneal. The crystalline regions, previously illustrated as epitaxy regions 402 and 404, are illustrated as post-anneal crystalline regions 602 and 604. The crystalline regions 602 and 604 are greater in volume and/or depth than the epitaxy regions 402 and 404. The crystalline region 602 completely fills the associated trench. The crystalline regions 602 and 604 include a first portion (denoted above as epitaxy regions 402 and 404) grown by an epitaxy process, and a second portion created by the anneal driven conversion of amorphous material to crystalline material. In an embodiment, the amorphous layer 502 is amorphous germanium, which is converted into crystalline germanium to form portions of the crystalline regions 602 and 604.

The method 100 then proceeds to block 114 where a chemical mechanical polish (CMP) process is performed on the substrate. The CMP process may planarize the substrate removing unreacted (e.g., still amorphous) portions of the amorphous layer. In embodiments, the CMP process may also remove portions of the crystalline region(s), for example, which overfill a trench. The portions of the crystalline regions may be used to form devices including PFETs, NFETS, finFETs, and the like. For example, a channel of a device may be disposed in the crystalline regions. Referring to the example of FIG. 7, a device 700 is illustrated, which includes a surface 702 having been created by a CMP process. A plurality of crystalline regions 704 and 706 are disposed on the substrate, with interposing STI features 204. The crystalline regions 704 may form a portion of an active device such as a fin of a finFET. The crystalline regions 706 may form an active region where one or more devices (e.g., PFET) are formed.

Figure 8:
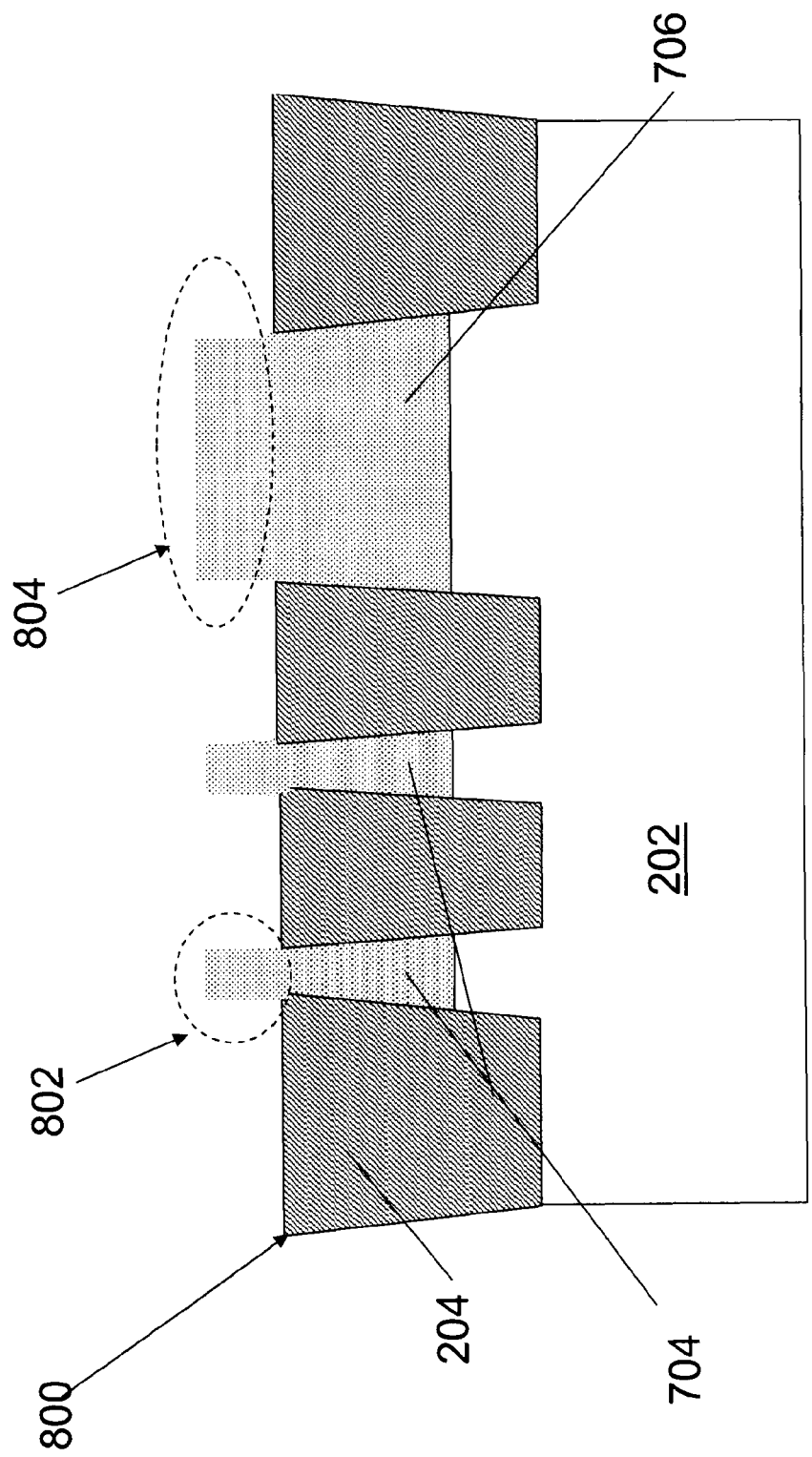

The method 100 then proceeds to block 116 where the isolation regions are etched. The isolation regions may be etched such that the single crystalline regions (e.g., epitaxially grown and/or converted by anneal) form raised elements on the substrate. In an embodiment, block 116 is omitted. Referring to the example of FIG. 8, illustrated are raised elements 802 and 804 of the device 800. The raised elements 802 and 804 include crystalline material. As described above, in an embodiment, the raised elements 802 and/or 804 include crystalline germanium. The raised elements 802 and/or 804 may provide active regions where a device, e.g., a PFET, or portion thereof may be formed. In an embodiment, the raised elements 802 provide fins of a finFET device. In an embodiment, the raised element 804 provides an active region where one or more devices may be formed. In an embodiment, a channel of a device (e.g., PFET, FinFET) is formed in the raised elements 802 and/or 804. The regions 802 and/or 804 may have substantially vertical sidewalls.

It is understood that the method 100 may continue with a CMOS process flow to form various structures and features such as gate structures, spacer elements, source/drain regions, silicide features, contact etch stop layers (CESL), additional inter-level dielectric (ILD) layers, contact/vias, interconnect layers, metal layers, dielectric layers, passivation layer and so forth. Various layers of a multiple layer interconnect (MLI) may be formed on the substrate to connect the various features described above.

Specifically, a gate structure may be formed on the crystalline regions such as 704 and 706. In an embodiment, the gate structure is a multigate structure, e.g., a finFET device. The gate structures may include a gate dielectric layer and a gate electrode layer. The gate dielectric layer may include a dielectric material such as silicon oxide, silicon nitride, silicon oxynitride, dielectric with a high dielectric constant (high k), and/or combinations thereof Examples of high k materials include hafnium silicate, hafnium oxide, zirconium oxide, aluminum oxide, hafnium dioxide-alumina ($HfO_2$—$Al_2O_3$) alloy, or combinations thereof. The gate electrode may include polysilicon, a metal composition such as, Cu, W, Ti, Ta, TiN, TaN, NiSi, CoSi, combinations thereof, and/or other suitable materials.

In summary, the methods and devices disclosed herein describes methods of forming a crystalline material on a semiconductor substrate. In doing so, the present disclosure offers several advantages over prior art devices. Advantages of some embodiments of the present disclosure include formation of a high-quality, low-defect rate crystalline material on a substrate. In an embodiment, this allows for formation of a high-mobility channel material on a silicon substrate. For example, a high-mobility channel material such as germanium may be co-integrated on a silicon substrate (wafer) with silicon based periphery devices (I/O, ESD). The high-mobility channel material may be used as a fin of finFET device disposed on a silicon substrate or channel of an active device. Embodiments of the present disclosure may improve within wafer uniformity, including of the crystalline layers created. One or more of these embodiments provide improved CMP conditions. Additionally, the crystalline material formed may be low-defect having no holes or other defects between merging layers that may be found during large epitaxial overgrowth of typical processes. It is understood that different embodiments disclosed herein offer different disclosure, and that they may make various changes, substitutions and alterations herein without departing from the spirit and scope of the present disclosure.

Thus, provided is an embodiment of a method which includes providing a semiconductor substrate and forming a trench on the semiconductor substrate. An epitaxy region is grown in the trench. An amorphous layer is then formed overlying the epitaxy region (e.g., with an interface to the epitaxy region). The semiconductor substrate including the amorphous layer is annealed.

In one example, a first and a second isolation region define the trench. In some embodiments, the method further includes performing a chemical mechanical polish (CMP) after annealing the semiconductor substrate. In an embodiment, the anneal is a solid phase epitaxy regrowth anneal. The SPER anneal may convert a portion of the amorphous layer overlying the epitaxy region to a crystalline structure substantially similar to the epitaxy region.

In one example, the semiconductor substrate has a first composition (e.g., Si) and the epitaxy region has a second composition different than the first composition (e.g., Ge). In some embodiments, forming the trench includes forming a first and a second shallow trench isolation (STI) feature in the substrate and removing a portion of the substrate interposing the first and second STI features to form a trench.

In another embodiment, a method is described, which includes providing a substrate having a first trench and growing an epitaxy material in the first trench, wherein the epitaxy material is a crystalline semiconductor material. An amorphous semiconductor layer is formed on the epitaxy material. The substrate is then annealing to convert a portion of the amorphous semiconductor layer into the crystalline semiconductor material.

In one example, the epitaxy material is germanium and the amorphous semiconductor layer is germanium. In a further embodiment, the substrate is silicon. The anneal may be a solid phase epitaxy region regrowth (SPER) anneal. In one example, the portion of the amorphous semiconductor layer that is converted to the crystalline material is disposed in the first trench. In some embodiments, the substrate includes a second trench having a different width than the first trench.

In one example of the embodiment, the method includes growing the epitaxy material in a second trench concurrently with growing the epitaxy material in the first trench. The epitaxy material may completely fill the second trench.

In yet another embodiment, a method is described that includes providing a semiconductor substrate having a trench and filling a first portion of the trench with a crystalline material. A second portion of the trench is filled with an amorphous semiconductor material. The semiconductor substrate including the amorphous semiconductor layer and the crystalline material is annealed to convert the amorphous semiconductor layer filling the second portion of the trench to the crystalline material. Thereafter, the amorphous semiconductor layer overlying the second portion of the trench (e.g., the unconverted material) is removed.

In one example, a channel of a device is formed in a region including the crystalline material. In another example, a finFET device is formed on the semiconductor substrate, wherein a fin of the finFET device includes the first and second portions of the trench. In certain embodiments, removing the amorphous semiconductor layer includes chemical mechanical polish. The method may further include etching material surrounding the trench to form a raised element including the crystalline material.

What is claimed is:
1. A method, comprising:
   providing a substrate;
   forming a first trench and a second trench in the semiconductor substrate, wherein the second trench has a greater width than the first trench;
   growing a first epitaxy region in the first trench, wherein the epitaxy region extends beyond an opening of the first trench;
   concurrently with growing the first epitaxy region, growing a second epitaxy region in the second trench, wherein a first portion of the second trench is not filled with the epitaxy region;
   forming an amorphous layer overlying the second epitaxy region;
   annealing the semiconductor substrate including the amorphous layer, wherein the annealing provides a crystalline region overlying the second epitaxy region; and performing a chemical mechanical polish (CMP) after annealing the semiconductor substrate such than the first and second epitaxy regions are co-planar.

2. The method of claim 1, wherein the performing the CMP provides a planar surface including a top surface of each of the first and second epitaxy regions and a top surface of an interposing isolation region.

3. The method of claim 1, wherein the amorphous layer is between approximately 200 nanometers (nm) and approximately 500 nm in thickness.

4. The method of claim 1, wherein the amorphous layer is less than 1 micron in thickness.

5. The method of claim 1, wherein the amorphous layer includes germanium.

6. The method of claim 5, wherein the first and second epitaxy regions include germanium.

7. The method of claim 1, wherein the forming the first trench and the second trench and the growing the first and second epitaxy regions are performed in-situ.

8. The method of claim 7, wherein the forming the first and second trenches includes:
    forming a plurality of shallow trench isolation (STI) features in the substrate; and
    removing a portion of the substrate interposing the STI features to form the first and second trenches.

9. A method, comprising:
    providing a substrate having a first trench and a second trench;
    growing an epitaxy material in the first trench, wherein the epitaxy material is a crystalline semiconductor material;
    growing the epitaxy material in the second trench, wherein a top surface of the epitaxy material in the first trench is noncollinear with a top surface of the epitaxy material in the second trench;
    forming an amorphous semiconductor layer on the epitaxy material; and
    converting a portion of the amorphous semiconductor layer into the crystalline semiconductor material.

10. The method of claim 9, wherein after the converting the portion of the amorphous semiconductor layer, a top surface of the crystalline semiconductor material disposed above the first trench is noncollinear with a top surface of the crystalline semiconductor material disposed above the second trench.

11. The method of claim 10, further comprising:
    performing a planarization process, wherein the planarization process provides a top surface of the crystalline semiconductor material disposed in the first trench collinear with a top surface of the crystalline semiconductor material disposed in the second trench.

12. The method of claim 9, wherein the first and second trench include different dimensions.

13. The method of claim 9, wherein the converting the portion of the amorphous semiconductor layer into the crystalline semiconductor material includes converting a portion of the amorphous semiconductor layer disposed in the first trench.

14. The method of claim 9, wherein the first trench and the second trench include substantially tapered sidewalls.

15. The method of claim 9, further comprising:
    forming a gate structure on the converted portion of the amorphous semiconductor layer into the crystalline semiconductor material.

16. A method, comprising:
    forming a first region of a crystalline material on a substrate;
    forming an amorphous semiconductor layer on the first region;
    converting at least a portion of the amorphous semiconductor layer to the crystalline material; and
    thereafter, etching an adjacent insulating layer to provide a raised element of the crystalline material, wherein the raised element includes a fin of the finFET element.

17. The method of claim 16, further comprising:
    performing a planarization process, wherein the planarization includes removing the amorphous semiconductor layer after the converting such that the crystalline material is coplanar with an adjacent insulating layer; and
    wherein the etching the adjacent insulating layer to provide the raised element is performed after the planarization process.

18. The method of claim 16, wherein a channel of a device is formed in the raised element.

19. The method of claim 16, wherein the forming the first region of the crystalline material includes epitaxially growing germanium.

* * * * *